(12) United States Patent
Choi et al.

(10) Patent No.: US 10,546,781 B2
(45) Date of Patent: Jan. 28, 2020

(54) DISPLAY DEVICE

(71) Applicant: LG Display Co., Ltd, Seoul (KR)

(72) Inventors: Sun-Hyun Choi, Gyeongsangbuk-do (KR); Ki-Taeg Shin, Daegu (KR); Tae-Yun Roh, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/684,755

(22) Filed: Aug. 23, 2017

(65) Prior Publication Data
US 2017/0352594 A1 Dec. 7, 2017

Related U.S. Application Data

(63) Continuation of application No. 15/223,959, filed on Jul. 29, 2016, now Pat. No. 9,768,068.

(30) Foreign Application Priority Data

Jul. 30, 2015 (KR) ........................ 10-2015-0108130

(51) Int. Cl.
*H01L 29/04* (2006.01)
*H01L 21/78* (2006.01)
(Continued)

(52) U.S. Cl.
CPC ........ *H01L 21/78* (2013.01); *G02F 1/136204* (2013.01); *H01L 22/32* (2013.01);
(Continued)

(58) Field of Classification Search
CPC . H04N 1/00021; H01L 27/32; H01L 27/3276; H01L 27/3288; H01L 27/124;
(Continued)

(56) References Cited

U.S. PATENT DOCUMENTS

2007/0120790 A1 5/2007 Jeon
2008/0074137 A1 3/2008 Kim et al.
(Continued)

FOREIGN PATENT DOCUMENTS

CN 1482508 A 3/2004
CN 101551964 A 10/2009
(Continued)

*Primary Examiner* — Cuong B Nguyen
(74) *Attorney, Agent, or Firm* — Seed Intellectual Property Law Group LLP

(57) ABSTRACT

Disclosed is a display device that includes an array substrate that includes a display region and a first non-display region, and includes a signal line connected to a pixel in the display region; a first signal transfer line that is at the first non-display region and transfers a test signal, and a second signal transfer line that transfers a test enable signal; a connection pattern connected to the first signal transfer line; a test transistor that is connected between the signal line and the connection pattern, and is connected to the second signal transfer line; and an electrostatic induction element that includes a dummy device in the form of either a dummy pattern and/or a dummy test transistor, the dummy pattern including a dummy connection pattern connected to the first signal transfer line, the dummy test transistor connected to the second signal transfer line.

20 Claims, 10 Drawing Sheets

(51) Int. Cl.
    *H01L 27/12*     (2006.01)
    *H01L 21/66*     (2006.01)
    *G02F 1/1362*     (2006.01)
    *H01L 21/77*     (2017.01)

(52) U.S. Cl.
    CPC ...... *H01L 27/1244* (2013.01); *H01L 27/1259* (2013.01); *G02F 2001/136254* (2013.01); *H01L 2021/775* (2013.01)

(58) Field of Classification Search
    CPC .............. H01L 23/52; H01L 27/14609; H01L 27/14641; H01L 21/78; H01L 27/1259; H01L 27/1244; H01L 22/32; H01L 2021/775; G02F 1/136204; G02F 2202/22; G02F 1/1309; G02F 2001/136254
    See application file for complete search history.

(56) References Cited

U.S. PATENT DOCUMENTS

| | | |
|---|---|---|
| 2010/0155724 A1 | 6/2010 | Hong et al. |
| 2012/0181539 A1 | 7/2012 | Han et al. |
| 2014/0203835 A1* | 7/2014 | Ro ........................ G09G 3/006 |
| | | 324/760.02 |

FOREIGN PATENT DOCUMENTS

| | | |
|---|---|---|
| CN | 101763817 A | 6/2010 |
| CN | 103163670 A | 6/2013 |

* cited by examiner

DISPLAY DEVICE

The present application is a continuation application of U.S. patent application Ser. No. 15/223,959, filed Jul. 29, 2016, which claims the priority benefit of Korean Patent Application No. 10-2015-0108130 filed in Republic of Korea on Jul. 30, 2015, which applications are hereby incorporated by reference in their entireties for all purposes as if fully set forth herein.

BACKGROUND OF THE INVENTION

Field of the Invention

The present invention relates to a display device. In particular, the present invention relates to a display device that can improve an electrostatic defect which happens after a cutting process by a cell region.

Discussion of the Related Art

Facing information society, display field of displaying electric information signals has been rapidly advanced, and accordingly, various flat display devices, such as a liquid crystal display device (LCD), a plasma display panel device (PDP), an organic light emitting diode display device (OLED), have been widely used.

Among the flat display devices, LCDs are most widely used because they have advantages of thin profile, light weight and low power consumption.

The LCD are configured with an array substrate, a color filter substrate as an opposing substrate, and a liquid crystal layer between the two substrates.

Each of an array substrate and a color filter substrate is manufactured in cell regions of a mother substrate, then the mother substrate is cut by the cell region, and then the cut array substrate and the cut color filter substrate are attached to each other with the liquid crystal layer therebetween to form a liquid crystal panel, and then test processes, including an auto probe test, for the liquid crystal panel is conducted.

Through such the processes, an LCD is manufactured. However, while the manufacturing processes of the LCD, electrostatic charges frequently flow inside the LCD. Particularly, the array substrate is very vulnerable to a static electricity because various driving elements are formed therein. Accordingly, a structure to prevent the inflow of the electrostatic charges is included in the array substrate.

FIG. 1 is a schematic view illustrating a mother substrate for an array substrate having an electrostatic induction line and an array substrate formed by a cutting process by a cell region according to the related art.

Referring to FIG. 1, in the mother substrate MG for an array substrate, array substrate regions are defined in cell regions CA, and an electrostatic induction line EDL as a discharge line to induct electrostatic charges thereto is formed. The electrostatic induction line EDL is arranged along a space between the cell regions CA and a peripheral space of the mother substrate MG, extends to a peripheral region in the cell area CA, and is connected to a ground terminal GND.

Accordingly, even though electrostatic charges flow inside the cell area CA in processes of manufacturing the array substrate AS in a state of the mother substrate MG, the electrostatic charges is brought to the outside through the electrostatic induction line EDL, and thus a defect of the array substrate AS by the static electricity can be prevented.

However, after manufacturing the array substrate AS in the state of the mother substrate MG is finished, the cutting by the cell region CA is conducted. Accordingly, the electrostatic induction line EDL located in the array substrate AS in the cut state is in a floating state.

Thus, the electrostatic induction line EDL of the array substrate AS after the cutting process loses its electrostatic induction function, and the array substrate AS and a liquid crystal panel including the same is vulnerable to a static electricity.

Accordingly, when electrostatic charges flow inside a non-display region, where the electrostatic induction line EDL is located, in following processes, a defect happens with a driving element or signal line in a display region, and the liquid crystal panel becomes defective.

Further, when a defect of an element and a line for an auto probe test located near the electrostatic induction line EDL happens by the static electricity, the auto probe test can't be conducted, and thus even a liquid crystal panel having no defect of a driving element or signal line in a display region is treated as a defective product.

SUMMARY OF THE INVENTION

Accordingly, the present invention is directed to a display device that substantially obviates one or more of the problems due to limitations and disadvantages of the related art.

An object of the present invention is to provide a display device that can improve an electrostatic defect which happens after a cutting process by a cell region.

Additional features and advantages of the disclosure will be set forth in the description which follows, and in part will be apparent from the description, or may be learned by practice of the disclosure. The advantages of the disclosure will be realized and attained by the structure particularly pointed out in the written description and claims as well as the appended drawings.

To achieve these and other advantages, and in accordance with the purpose of the present invention, as embodied and broadly described herein, a display device includes an array substrate that includes a display region and a first non-display region, and includes a signal line connected to a pixel in the display region; a first signal transfer line that is at the first non-display region and transfers a test signal, and a second signal transfer line that transfers a test enable signal; a connection pattern connected to the first signal transfer line; a test transistor that is connected between the signal line and the connection pattern, and is connected to the second signal transfer line; and an electrostatic induction element that includes a dummy device in the form of either a dummy pattern and/or a dummy test transistor, the dummy pattern including a dummy connection pattern connected to the first signal transfer line, the dummy test transistor connected to the second signal transfer line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF THE ILLUSTRATED EMBODIMENTS

Reference will now be made in detail to embodiments, examples of which are illustrated in the accompanying drawings. The same or like reference numbers may be used throughout the drawings to refer to the same or like parts.

For the purpose of explanations, embodiments of the present invention are described with as an LCD and an array substrate thereof as a display device and an array substrate thereof by way of example.

Figure 1:
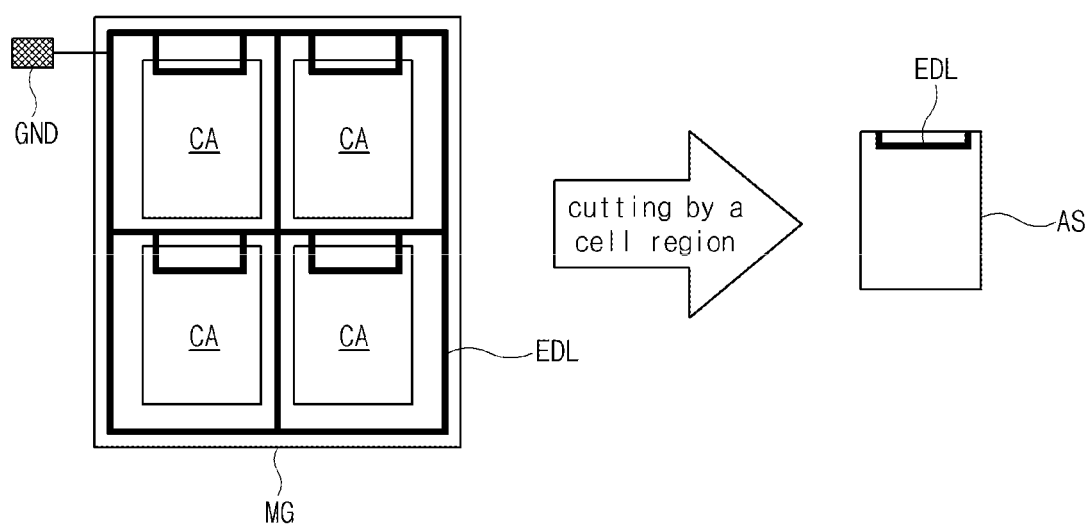
FIG. 1 is a schematic view illustrating a mother substrate for an array substrate having an electrostatic induction line and an array substrate formed by a cutting process by a cell region according to the related art.
Figure 2:
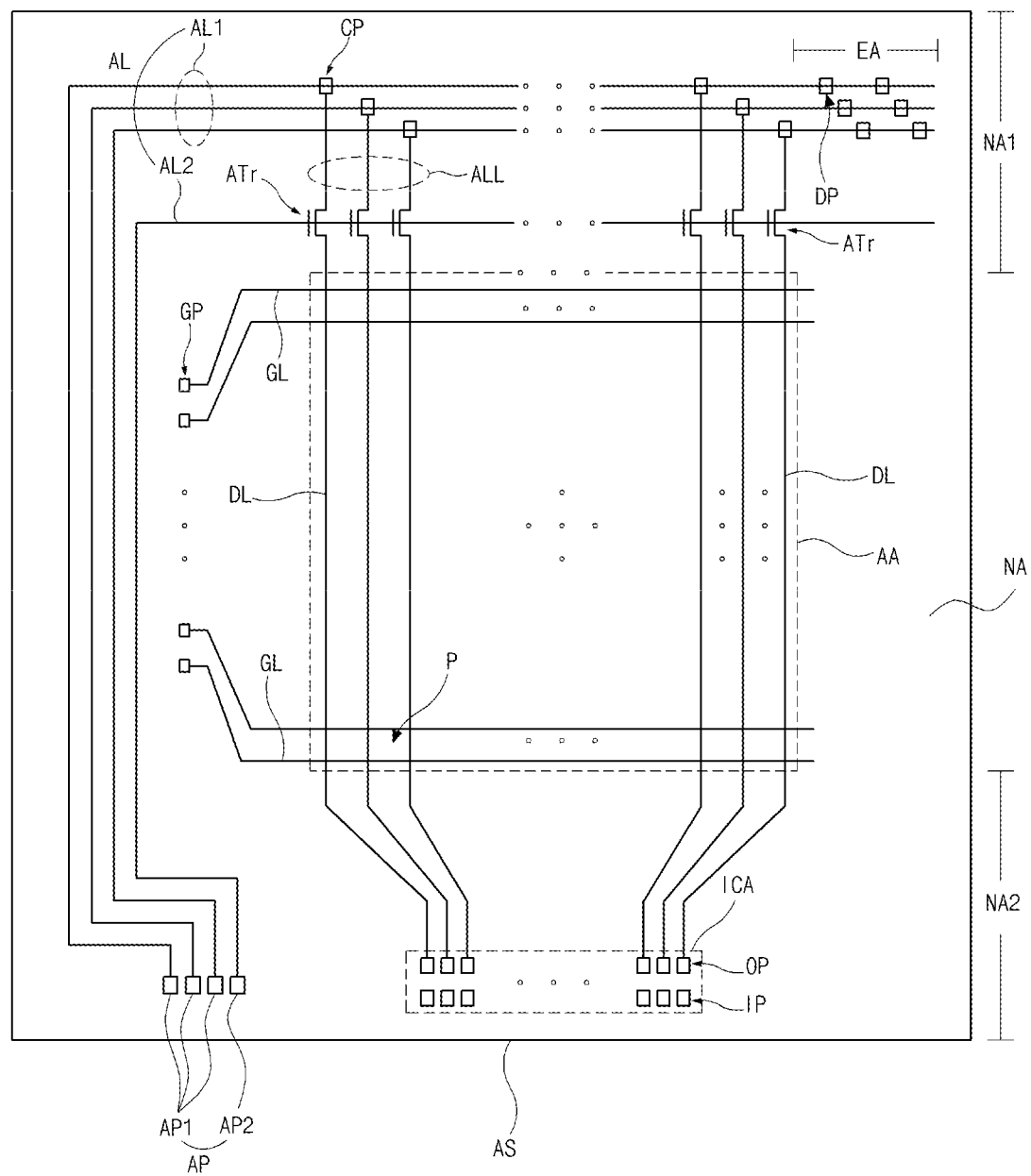
FIG. 2 is a schematic view illustrating an array substrate of an LCD according to a first embodiment of the present invention.

FIG. 2 is a schematic view illustrating an array substrate of an LCD according to a first embodiment of the present invention.

Referring to FIG. 2, in the array substrate AS, a display region AA and a non-display region NA surrounding the display region AA are defined.

The array substrate AS includes a plurality of gate lines GL extending in a first direction and traversing the display region AA, and a plurality of data lines DL extending in a second direction crossing the first direction and traversing the display region AA. The gate lines GL and the data lines DL define pixel regions P in a matrix form in the display region AA.

Figure 6:
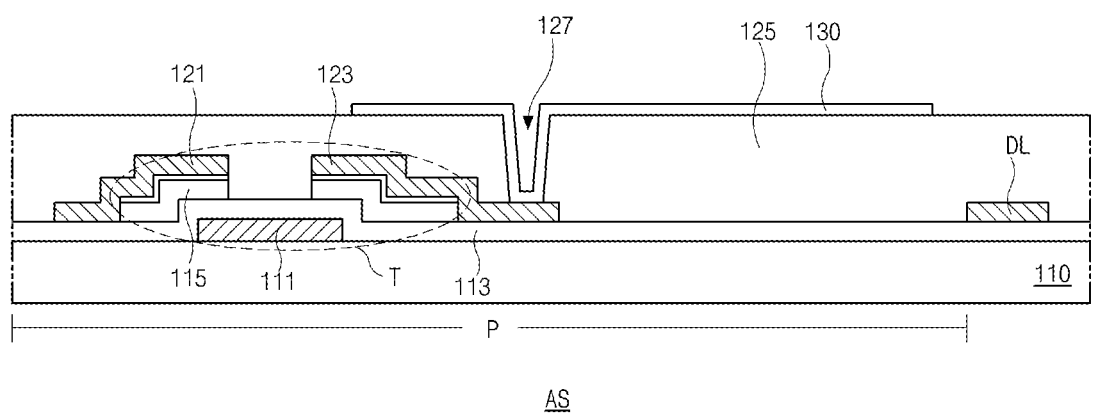
FIG. 6 is a schematic view illustrating a pixel structure of an LCD according to the first embodiment of the present invention.

Regarding a pixel structure of the array substrate AS, referring further to FIG. 6, in each pixel region P, a thin film transistor T as a switching element connected to the corresponding gate line GL and data line DL, and a pixel electrode 130 connected to the thin film transistor T are formed.

The thin film transistor T includes a gate electrode 111 on a substrate 110, a gate insulating layer 113 on the gate electrode 111, a semiconductor layer 115 on the gate insulating layer 113, and source and drain electrodes 121 and 123 spaced apart from each other on the semiconductor layer 115.

The gate line GL may be formed in the same process and of the same material as the gate electrode 111, and the data line DL may be formed in the same process and of the same material as the source and drain electrodes 121 and 123.

A passivation layer 125 is formed on the source and drain electrodes 121 and 123, and a drain contact hole 127 exposing the drain electrode 123 is formed in the passivation layer 125. The pixel electrode 130 is connected to the drain electrode 123 through the drain contact hole 127.

Even though not shown in the drawings, a common electrode corresponding to the pixel electrode 130 may be formed in an opposing substrate, for example, a color filter substrate facing the array substrate to produce an electric field, and arrangement of liquid crystal molecules may change by the electric field.

In the case that the pixel electrode 130 and the common electrode are formed in different substrates, liquid crystal molecules are operated by an electric field vertical to the substrate.

In another example, a common electrode may be formed in the array substrate AS along with the pixel electrode 130, and in this case, liquid crystal molecules are operated by an electric field substantially parallel with the substrate.

Referring to FIG. 2, in the non-display region NA, various lines and pads transferring driving signals to operate the pixels P are formed.

For the purpose of explanations, the non-display region P located at a top portion on FIG. 2 is referred to as a first non-display region NA1, and the non-display region P located at a bottom portion on FIG. 2 is referred to as a second non-display region NA2.

In the second non-display region NA2, an IC region ICA, where a driving circuit, for example, an driving IC to operate a liquid crystal panel is mounted, may be defined. In the IC region ICA, pads coupled to bumps of the driving IC may be formed. In other words, input pads IP corresponding to input pads of the driving IC and output pads OP corresponding to output pads of the driving IC may be formed.

Even though not shown in the drawings, connection pads to receive driving signals output from a driving board, which is connected to the liquid crystal panel through a flexible printed circuit film, may be formed in the second non-display region NA2. The connection pads may be configured to be coupled to connection terminals of the flexible printed circuit board and to be connected to the corresponding input pads IP through corresponding lines.

The output pad OP is connected to one end of the corresponding data line DL. Accordingly, a data signal output from the driving IC is transferred to the data line DL through the output pad OP and applied to the corresponding pixel region P.

One end of the gate line GL is connected to the corresponding gate pad GP located in the non-display region NA and is supplied with a gate signal to operate the gate line GL.

In a portion of the second non-display region NA2, for example, in a region outside the IC region ICA, test pads AP to conduct an auto probe test may be formed. In another example, the test pads AP may be located in other non-display region NA different from the second non-display region NA.

In the auto probe test, the test pads AP are in contact with corresponding probes and supplied with test signals. The test pads AP may include, for example, a first test pad AP supplied with a test data signal, and a second test pad AP2 supplied with a test enable signal to control output of the test data signal into the display region AA.

In the auto probe test, a test gate signal may be supplied directly to the gate pad GP. In other words, the gate pad GP may be configured such that it functions as a test pad thus contacts a corresponding probe to receive the test gate signal.

In another example, a test pad supplied with a test gate signal, and a test pad supplied with a test enable signal to control output of the test gate signal into the display region AA may be further formed.

In the first non-display region NA1 opposite to the second non-display region NA2 with the display region AA therebetween, signal lines and elements for the auto probe test are arranged. In this regard, in the second non-display region NA2, the various signal lines and elements to operate the liquid crystal panel are formed and the driving IC is mounted, and particularly, a width of the non-display region is very small in order to achieve a narrow bezel, and thus the second non-display region NA2 lacks a space having test elements and signal lines arranged therein. Thus, it is preferable, but not limited, that signal lines and elements for the auto probe test are arranged in the first non-display region NA1 having a relatively more free space.

In the first non-display region NA1, signal transfer lines AL are formed and extends along a length direction of the first non-display region NA1 (i.e., a horizontal direction on the drawings). The signal transfer lines AL may be configured to extend in the non-display region between the first and second non-display regions NA1 and NA2 to be connected to the corresponding test pads AP.

The signal transfer lines AL may include a first signal transfer line AL1 connected to the first test pad AP1 to transfer the test data signal, and a second signal transfer line AL2 connected to the second test pad AP2 to transfer the test enable signal.

A plurality of first signal transfer lines AL1 and a plurality of corresponding first test pads API may be used, and for the purpose of explanations, this embodiment is described with three first transfer lines AL1 and three first test pads API by way of example.

The three first signal transfer lines AL1 may be alternately connected to the other ends of the data lines DL. In other words, the three first signal transfer lines AL1 may correspond to three neighboring data lines, respectively.

To connect the first signal transfer lines AL1 to the corresponding data lines DL, leading lines ALL extending from the corresponding first signal transfer lines AL1 in a direction to the display region AA may be formed. One end of the leading line ALL may be in contact with the corresponding first signal transfer line AL1 through a connection pattern CP.

Further, the other end of the leading line ALL is connected to a signal input terminal i.e., a source terminal of a test transistor ATr formed in the first non-display region NA1. An output terminal i.e., a drain terminal of the test transistor ATr is connected to the other end of the data line DL. As such, the test transistor ATr is located between the leading line ALL and the data line DL.

A control terminal i.e., a gate terminal of the test transistor ATr is connected to the second signal transfer line AL2. Accordingly, the test transistor ATr is operated to be turned on or off according to the test enable signal transferred through the second signal transfer line AL2 and controls an output of the test data signal.

A plurality of dummy devices in the form of dummy patterns DP are formed in the first non-display region NA1 and function as electrostatic induction elements. The dummy pattern DP are formed at one end portions EA of the first signal transfer lines AL1 i.e., at terminating portions, in a signal transfer direction, of the signal transfer lines AL1.

The dummy patterns DP are connected to the first signal transfer lines AL1 with the same arrangement as the connection patterns CP but have no electrical connection with an inside of the display region AA unlike the connection patterns CP. In other words, the dummy patterns DP are configured to be in connection with the first signal transfer line AL1 and output no test data signal.

Figure 3:
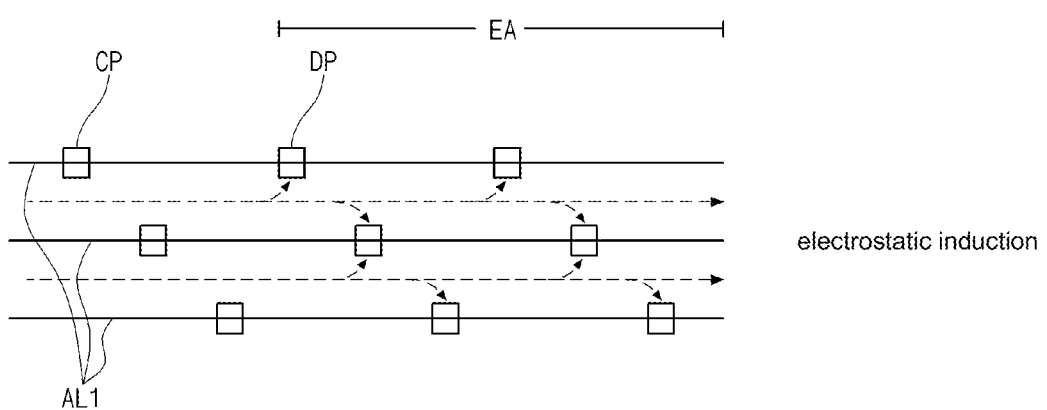
FIG. 3 is a view illustrating an induction of electrostatic charges into a dummy pattern in an LCD according to the first embodiment of the present invention.

The dummy pattern DP is a conductor and functions inherently to bring charges thereinto. Further, regarding electric components in the first non-display region NA1, from the point of view of an electric circuit, the dummy patterns DP are a conductor located at an endmost portion, and thus charges flow into the dummy patterns DP much more than other electric components having an electrical connection relation with the display region AA Accordingly, referring to FIG. 3, electrostatic charges flowing into the first non-display region NA1 can be mostly inducted into the dummy patterns DP. Accordingly, it can be prevented that a defect of the test signal transfer line AL or test transistor ATr, or a defect of a signal line or driving element in the display region AA happens due to a static electricity.

Further, even though excessive electrostatic charges flow into the dummy pattern DP and an electrostatic burst happens, this does not substantially influence the transfer of the test signals because the dummy patterns DP are located at the end portions EA of the signal transfer lines AL.

Figure 4:
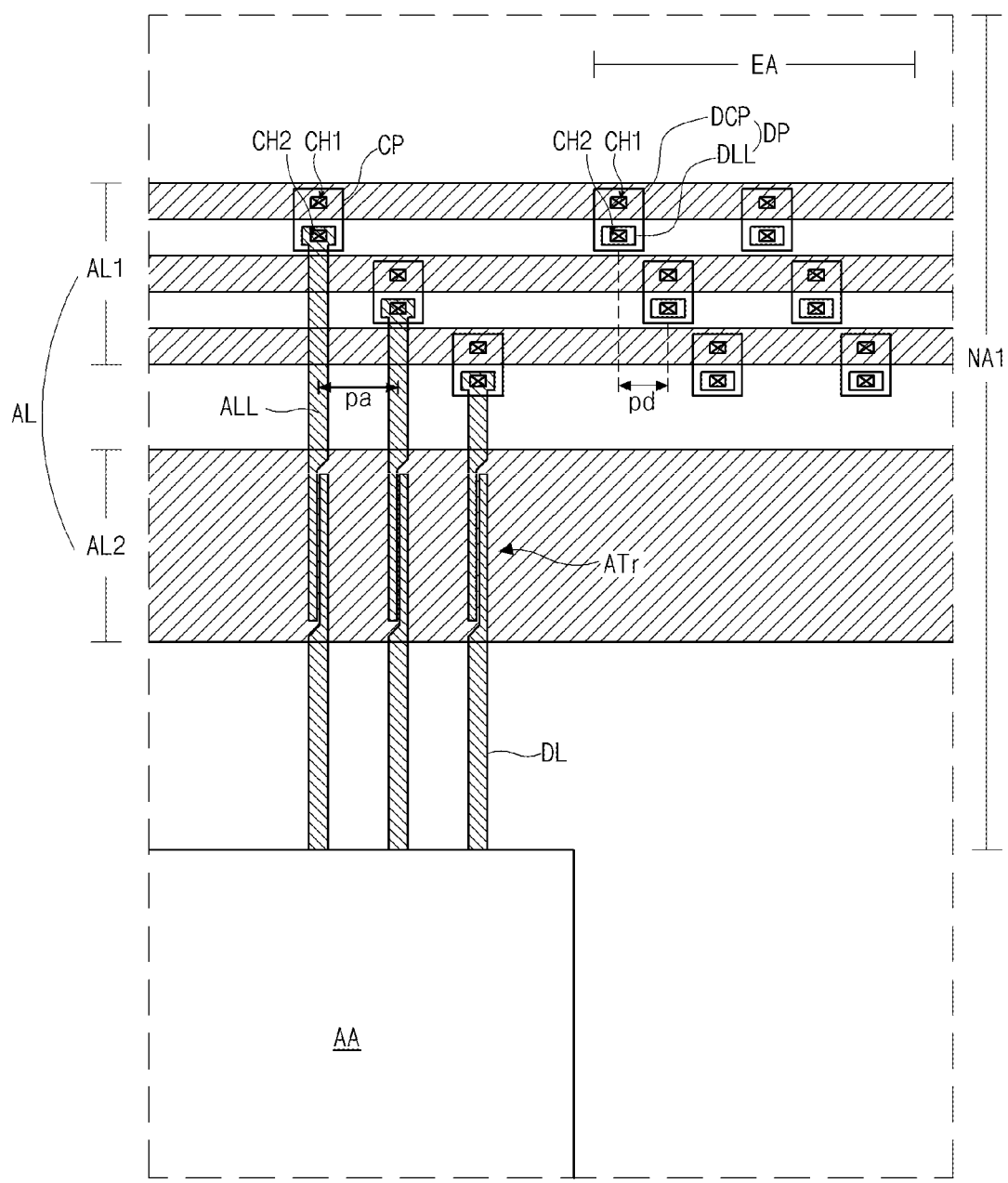
FIG. 4 is a view enlarging a portion of a first non-display region of an array substrate according to the first embodiment of the present invention.

A structure of components arranged in the first non-display region NA1 is explained in detail with further reference to FIG. 4.

The connection pattern CP connecting the first signal transfer line AL1 and leading line ALL corresponding to each other may contact the first signal transfer line AL1 through a first contact hole CH1, and contact the leading line ALL through a second contact hole CH2.

In this regard, the first signal transfer line AL1 and the leading line ALL are arranged with at least one insulating layer therebetween in a cross section view. For example, the first signal transfer line AL1 may be formed at the same process and of the same material as the gate line GL, the leading line ALL may be formed at the same process and of the same material as the data line DL, and the gate insulating layer (113 of FIG. 6) may be located between the first signal transfer line AL1 and the leading line ALL. The connection pattern CP may be formed at the same process and of the same material as the pixel electrode (130 of FOG. 6), and the passivation layer (125 of FIG. 6) may be located between the connection pattern CP and the leading line ALL.

The test transistor ATr may be configured with a part of the second signal transfer line AL2 as a gate terminal i.e., a gate electrode, a part of the leading line ALL as a source terminal i.e., a source electrode, and a part of the data line DL as a drain terminal i.e., a drain electrode. Even though not shown in the drawings, a semiconductor layer may be located over the gate electrode. The test transistor ATr may be formed at the same process as the thin film transistor (T of FIG. 6) in the pixel region P.

The dummy pattern DP is located at the outside of the connection pattern CP located last with respect to the test signal transfer direction i.e., at the end portion EA of the first signal transfer line AL1.

The dummy pattern DP may be configured with a dummy connection pattern DCP and a dummy leading line DLL. The dummy connection pattern DCP is a dummy pattern for the connection pattern CP and is formed substantially in the same shape as the dummy pattern CP. The dummy leading line DLL is a dummy line for the leading line ALL, and may have a shape of at least part of the leading line ALL, and in this embodiment, the dummy leading line DLL in a shape of a pad of the leading line ALL is shown by way of example.

In this embodiment, it is preferable, but not limited, that a layout spacing between the neighboring dummy patterns DP i.e., a pitch pd of the dummy patterns DP is less than a pitch pa of patterns for test corresponding to the dummy patterns DP. Particularly, when the pitch pd of the dummy patterns DP is less than the pitch pa of the corresponding connection patterns CP or leading patterns ALL, a number of the dummy patterns DP per unit area increases, and thus an electrostatic induction effect can be further improved.

As described above, by forming the dummy patterns DP as the electrostatic induction elements, the related art electrostatic induction line does not need, and thus better use of a space for the first non-display region NA1 can be made. Particularly, a common voltage line located in the first non-display region NA1 can be formed at a larger area.

Figure 5:
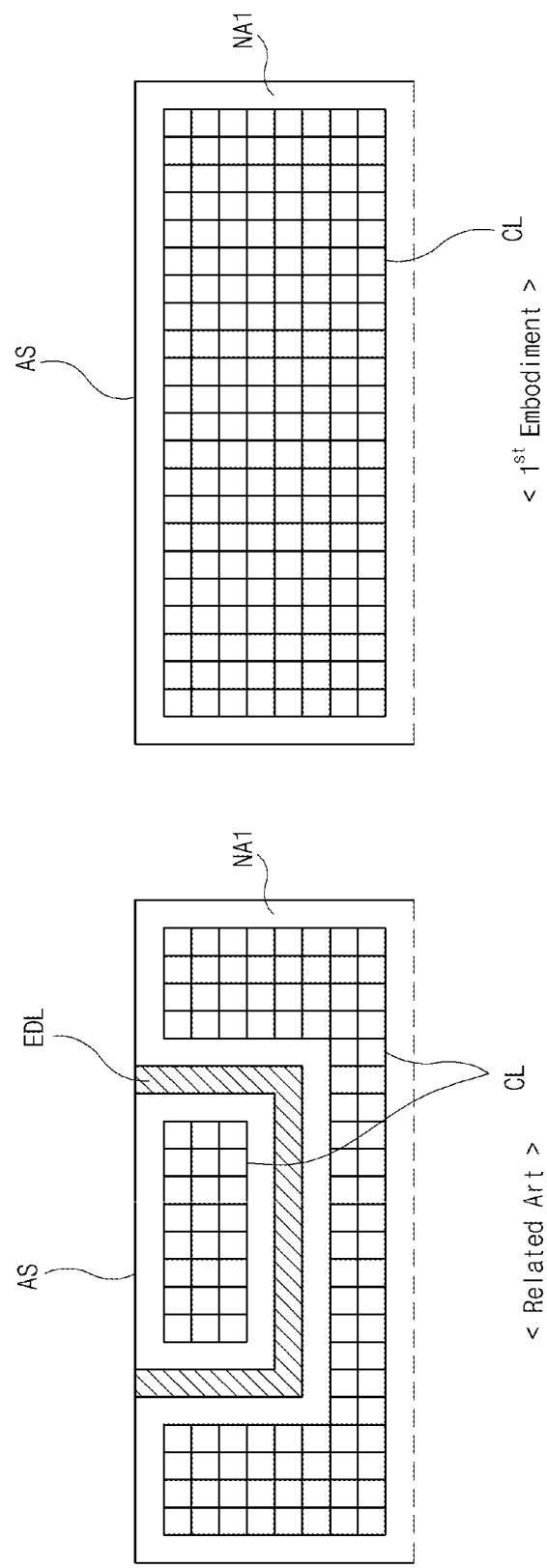
FIG. 5 is a schematic view illustrating arrangements of common voltage lines of first non-display regions of array substrates of the related art and the first embodiment of the present invention.

This is explained with further reference to FIG. 5. FIG. 5 is a schematic view illustrating arrangements of common voltage lines of first non-display regions of array substrates of the related art and the first embodiment of the present invention. For the purpose of explanations, the common voltage lines CL are mainly shown in the drawings. The common voltage lines CL are located outside the lines and elements for test.

Referring to FIG. 5, in the related art, since the electrostatic induction line EDL is formed in the first non-display region NA1, the common voltage line CL is arranged at a region of the first non-display region NA1 except for the region of the electrostatic induction line EDL, and thus an area occupied by the common voltage line CL is relatively small. Accordingly, a capability to maintain a common voltage inside the display region AA is relatively reduced, and a display quality defect such as a flicker may happen.

In contrast, in this embodiment, since the dummy patterns DP are used as the electrostatic induction element, the related art electrostatic induction line EDL can be eliminated, and an area to form the common voltage line CL can increase. Accordingly, a capability to maintain a common voltage inside the display region AA can be improved, and a display quality defect such as a flicker can be prevented.

This embodiment can be applied to an example that in order to output test gate signals to the display region, test pads, test signal transfer lines, and test transistors are used.

Figure 7:
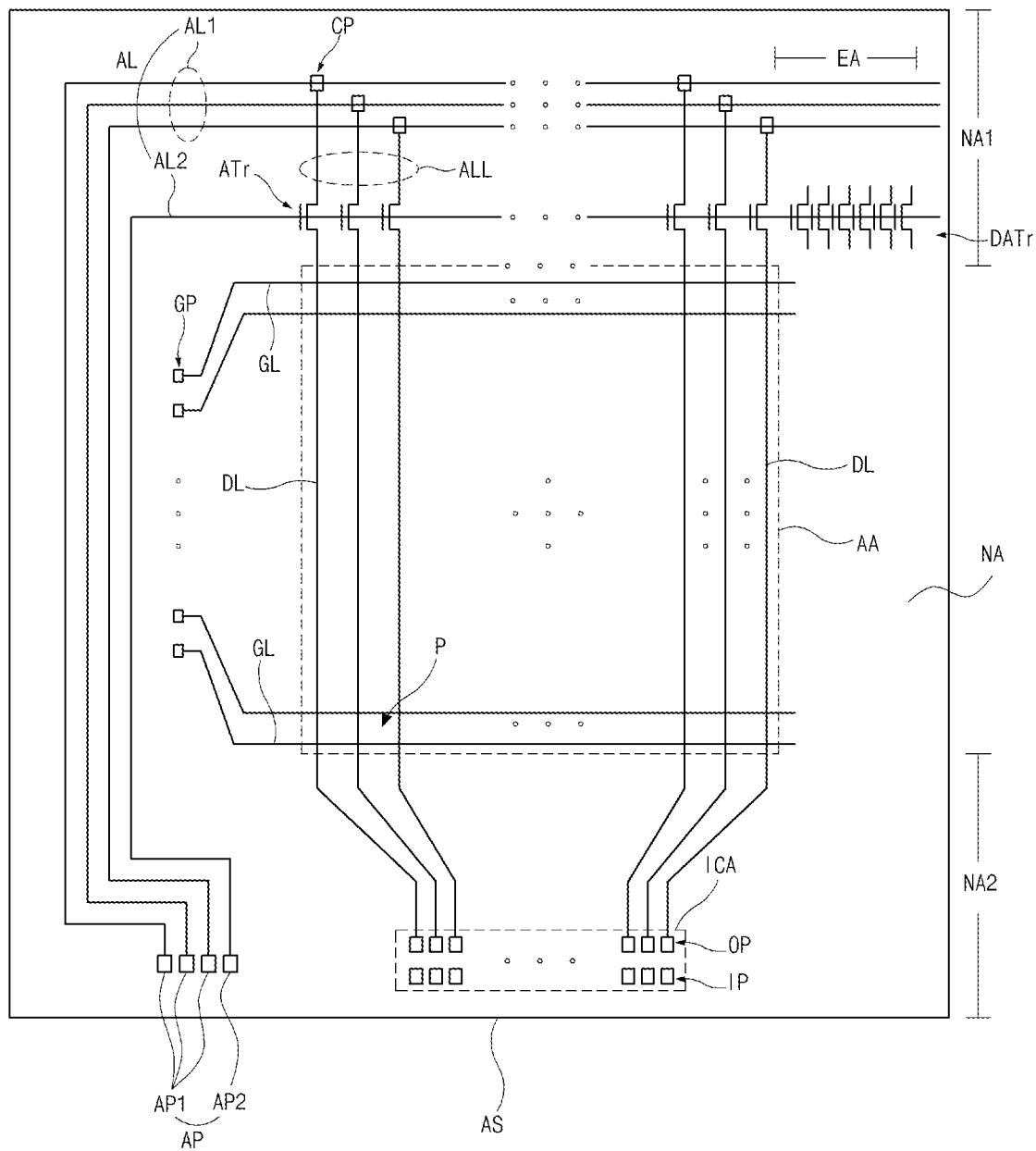
FIG. 7 is a schematic view illustrating an array substrate of an LCD according to a second embodiment of the present invention.
Figure 8:
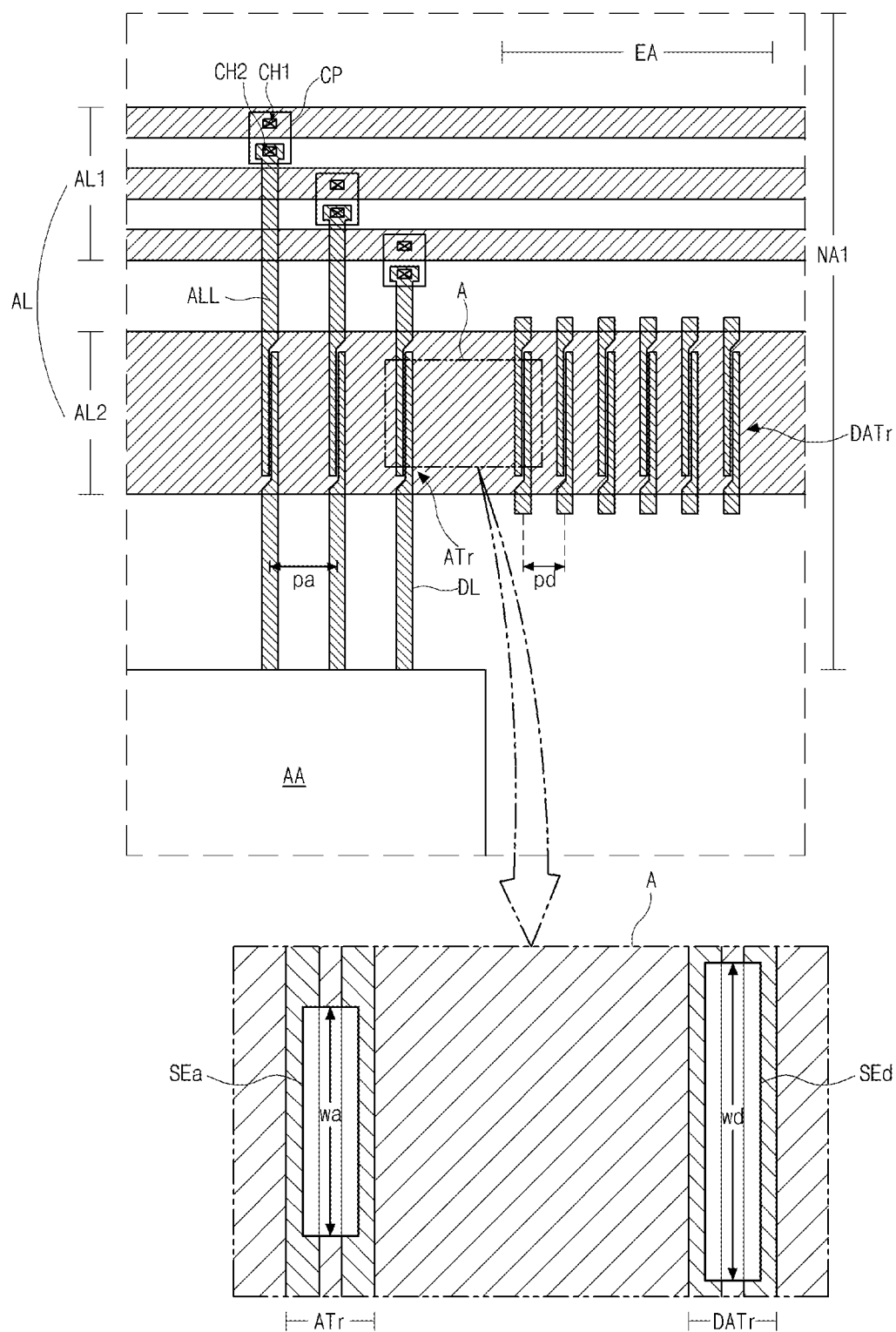
FIG. 8 is a view enlarging a portion of a first non-display region of an array substrate according to the second embodiment of the present invention.

FIG. 7 is a schematic view illustrating an array substrate of an LCD according to a second embodiment of the present invention, and FIG. 8 is a view enlarging a portion of a first non-display region of an array substrate according to the second embodiment of the present invention.

The array substrate AS of the second embodiment is similar to that of the first embodiment, except for a component functioning as an electrostatic induction element, and explanations of the similar parts may be omitted.

Referring to FIG. 7, in the array substrate AS, a display region AA and a non-display region NA surrounding the display region AA are defined, and the non-display region NA includes first and second non-display regions NA1 and NA2 located opposite to each other with the display region AA therebetween.

In the second non-display region NA2, an IC region ICA, where a driving circuit, for example, an driving IC to operate a liquid crystal panel is mounted, may be defined. In the IC region ICA, pads coupled to bumps of the driving IC may be formed. In other words, input pads IP corresponding to input pads of the driving IC and output pads OP corresponding to output pads of the driving IC may be formed.

Even though not shown in the drawings, connection pads to receive driving signals output from a driving board, which is connected to the liquid crystal panel through a flexible printed circuit film, may be formed in the second non-display region NA2. The connection pads may be configured to be coupled to connection terminals of the flexible printed circuit board and to be connected to the corresponding input pads IP through corresponding lines.

The output pad OP is connected to one end of the corresponding data line DL. Accordingly, a data signal output from the driving IC is transferred to the data line DL through the output pad OP and applied to the corresponding pixel region P.

One end of the gate line GL is connected to the corresponding gate pad GP located in the non-display region NA and is supplied with a gate signal to operate the gate line GL.

In a portion of the second non-display region NA2, for example, in a region outside the IC region ICA, test pads AP to conduct an auto probe test may be formed. In another example, the test pads AP may be located in other non-display region NA different from the second non-display region NA.

In the auto probe test, the test pads AP are in contact with corresponding probes and supplied with test signals. The test pads AP may include, for example, a first test pad AP supplied with a test data signal, and a second test pad AP2 supplied with a test enable signal to control output of the test data signal into the display region AA.

In the auto probe test, a test gate signal may be supplied directly to the gate pad GP. In other words, the gate pad GP may be configured such that it functions as a test pad thus contacts a corresponding probe to receive the test gate signal.

In another example, a test pad supplied with a test gate signal, and a test pad supplied with a test enable signal to control output of the test gate signal into the display region AA may be further formed.

In the first non-display region NA1, signal transfer lines AL are formed and extends along a length direction of the first non-display region NA1 (i.e., a horizontal direction on the drawings). The signal transfer lines AL may be configured to extend in the non-display region between the first and second non-display regions NA1 and NA2 to be connected to the corresponding test pads AP.

The signal transfer lines AL may include a first signal transfer line AL1 connected to the first test pad AP1 to transfer the test data signal, and a second signal transfer line AL2 connected to the second test pad AP2 to transfer the test enable signal.

A plurality of first signal transfer lines AL1 and a plurality of corresponding first test pads AP1 may be used, and for the purpose of explanations, this embodiment is described with three first transfer lines AL1 and three first test pads AP1 by way of example.

The three first signal transfer lines AL1 may be alternately connected to the other ends of the data lines DL. In other words, the three first signal transfer lines AL1 may correspond to three neighboring data lines, respectively.

To connect the first signal transfer lines AL1 to the corresponding data lines DL, leading lines ALL extending from the corresponding first signal transfer lines AL1 in a direction to the display region AA may be formed. One end of the leading line ALL may be in contact with the corresponding first signal transfer line AL1 through a connection pattern CP.

Further, the other end of the leading line ALL is connected to a signal input terminal i.e., a source terminal of a test transistor ATr formed in the first non-display region NA1. An output terminal i.e., a drain terminal of the test transistor ATr is connected to the other end of the data line DL. As such, the test transistor ATr is located between the leading line ALL and the data line DL.

A control terminal i.e., a gate terminal of the test transistor ATr is connected to the second signal transfer line AL2. Accordingly, the test transistor ATr is operated to be turned on or off according to the test enable signal transferred through the second signal transfer line AL2 and controls an output of the test data signal.

A plurality of dummy test transistors DATr are formed in the first non-display region NA1 and function as electrostatic induction elements in one embodiment of the dummy device, which embodiment will now be explained. The dummy test transistors DATr are formed at an end portion EA of the second signal transfer line AL2 i.e., at a terminating portion, in a signal transfer direction, of the signal transfer line AL2.

The dummy test transistors DATr have substantially the same structure as the test transistors ATr but have no electrical connection with an inside of the display region AA unlike the test transistors ATr. In other words, the dummy test transistors DATr are configured to be in connection with the second signal transfer line AL2 and have no input and output structure for the test data signal.

The dummy test transistor DATr is a conductor and a capacitor and functions inherently to bring charges thereinto. Further, regarding electric components in the first non-display region NA1, from the point of view of an electric circuit, the dummy test transistors DATr are a conductor and a capacitor located at an endmost portion, and thus charges flow into the dummy test transistors DATr much more than other electric components having an electrical connection relation with the display region AA Accordingly, electrostatic charges flowing into the first non-display region NA1 can be mostly inducted into the dummy test transistors DATr. Accordingly, it can be prevented that a defect of the test signal transfer line AL or test transistor ATr, or a defect of a signal line or driving element in the display region AA happens due to a static electricity.

Further, even though excessive electrostatic charges flow into the dummy test transistor DATr and an electrostatic burst happens, this does not substantially influence the transfer of the test signals because the dummy test transistors DATr are located at the end portion EA of the signal transfer line AL.

A structure of components arranged in the first non-display region NA1 is explained in detail with further reference to FIG. 8.

The connection pattern CP connecting the first signal transfer line AL1 and leading line ALL corresponding to each other may contact the first signal transfer line AL1 through a first contact hole CH1, and contact the leading line ALL through a second contact hole CH2.

In this regard, the first signal transfer line AL1 and the leading line ALL are arranged with at least one insulating layer therebetween in a cross section view. For example, the first signal transfer line AL1 may be formed at the same process and of the same material as the gate line GL, the leading line ALL may be formed at the same process and of the same material as the data line DL, and the gate insulating layer (113 of FIG. 6) may be located between the first signal transfer line AL1 and the leading line ALL. The connection pattern CP may be formed at the same process and of the same material as the pixel electrode (130 of FOG. 6), and the passivation layer (125 of FIG. 6) may be located between the connection pattern CP and the leading line ALL.

The test transistor ATr may be configured with a part of the second signal transfer line AL2 as a gate terminal i.e., a gate electrode, a part of the leading line ALL as a source terminal i.e., a source electrode, and a part of the data line DL as a drain terminal i.e., a drain electrode. Even though not shown in the drawings, a semiconductor layer may be located over the gate electrode. The test transistor ATr may be formed at the same process as the thin film transistor (T of FIG. 6) in the pixel region P.

The dummy test transistor DATr is located at the outside of the test transistor ATr located last with respect to the test signal transfer direction i.e., at the end portion EA of the second signal transfer line AL2.

The dummy test transistor DATr may include a dummy leading line DLL and a dummy data line DDL that are spaced apart from each other over the second signal transfer line AL2. The dummy leading line DLL is a dummy line for the leading line ALL, and may have a shape of at least part of the leading line ALL, and in this embodiment, the dummy leading line DLL having a length less than the leading line ALL is shown by way of example. The dummy data line DDL is a dummy line for the data line DL, and may have a shape of at least part of the data line DL, and in this embodiment, the dummy data line DDL having a length less than the data line DL is shown by way of example.

In this embodiment, it is preferable, but not limited, that a layout spacing between the neighboring dummy test transistors DATr i.e., a pitch pd of the dummy test transistors DATr is less than a pitch pa of the corresponding test transistors ATr. Particularly, when the pitch pd of the dummy test transistors DATr is less than the pitch pa of the test transistors ATr, a number of the dummy test transistors DATr per unit area increases, and thus an electrostatic induction effect can be further improved.

Further, referring to the drawing enlarging a region "A" in FIG. 8, semiconductor layers SEa and SEd of the test transistor ATr and the dummy test transistor DATr are shown. It is preferable, but not limited, that a channel width wd of the semiconductor layer SEd of the dummy test transistor DATr is greater than a channel width wa of the semiconductor layer SEa of the test transistor ATr. Particularly, when a channel width wd of the semiconductor layer SEd of the dummy test transistor DATr is greater than a channel width wa of the semiconductor layer SEa of the test transistor ATr, a channel current property of the dummy test transistor DATr increases, and an electrostatic induction effect can be further improved.

As described above, by forming the dummy test transistors DATr as the electrostatic induction elements, the related art electrostatic induction line does not need, and thus better use of a space for the first non-display region NA1 can be made. Particularly, a common voltage line located in the first non-display region NA1 can be formed at a larger area. Accordingly, a capability to maintain a common voltage inside the display region AA can be improved, and a display quality defect such as a flicker can be prevented.

This embodiment can be applied to an example that in order to output test gate signals to the display region, test pads, test signal transfer lines, and test transistors are used.

Figure 9:
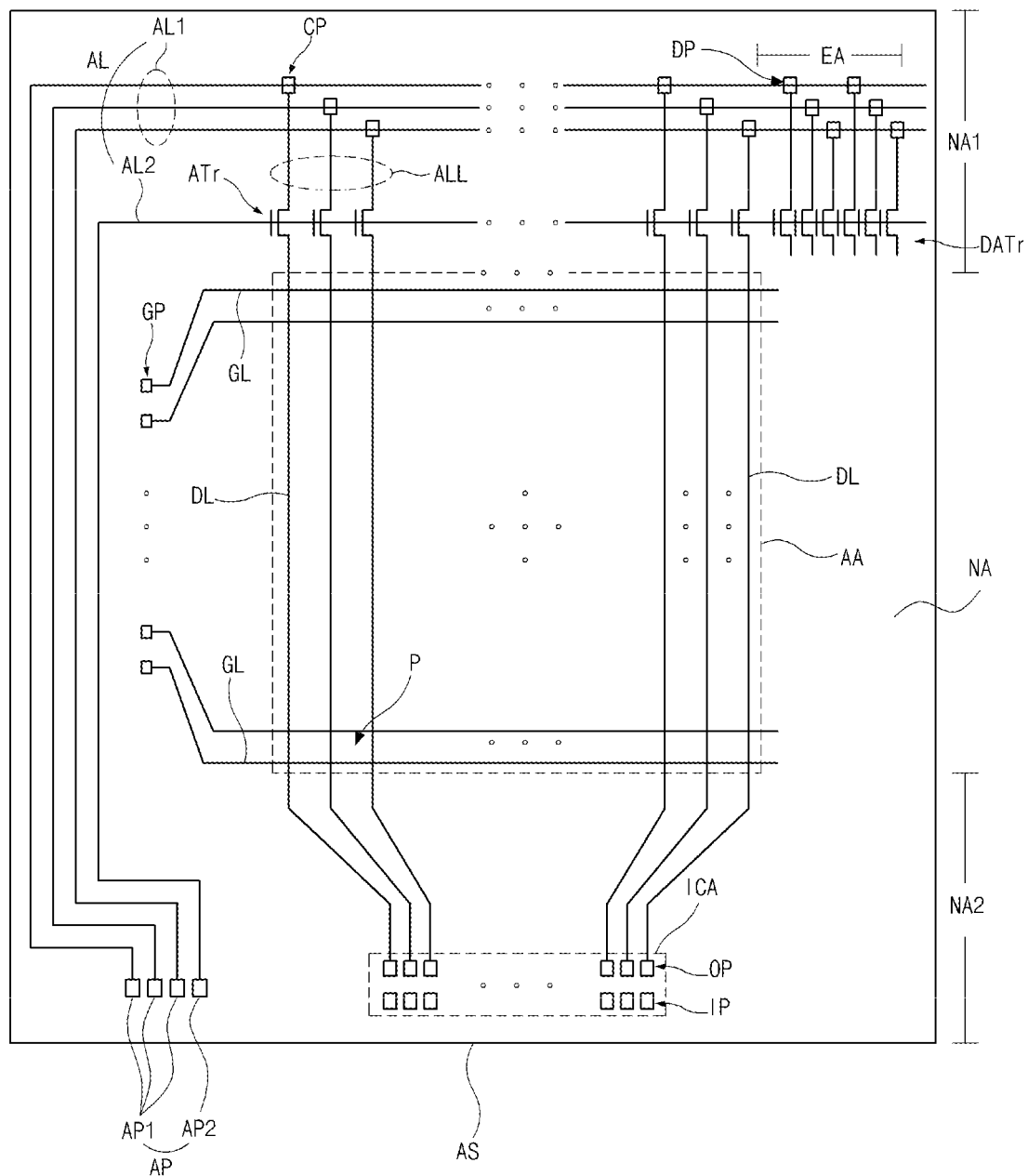
FIG. 9 is a schematic view illustrating an array substrate of an LCD according to a third embodiment of the present invention.
Figure 10:
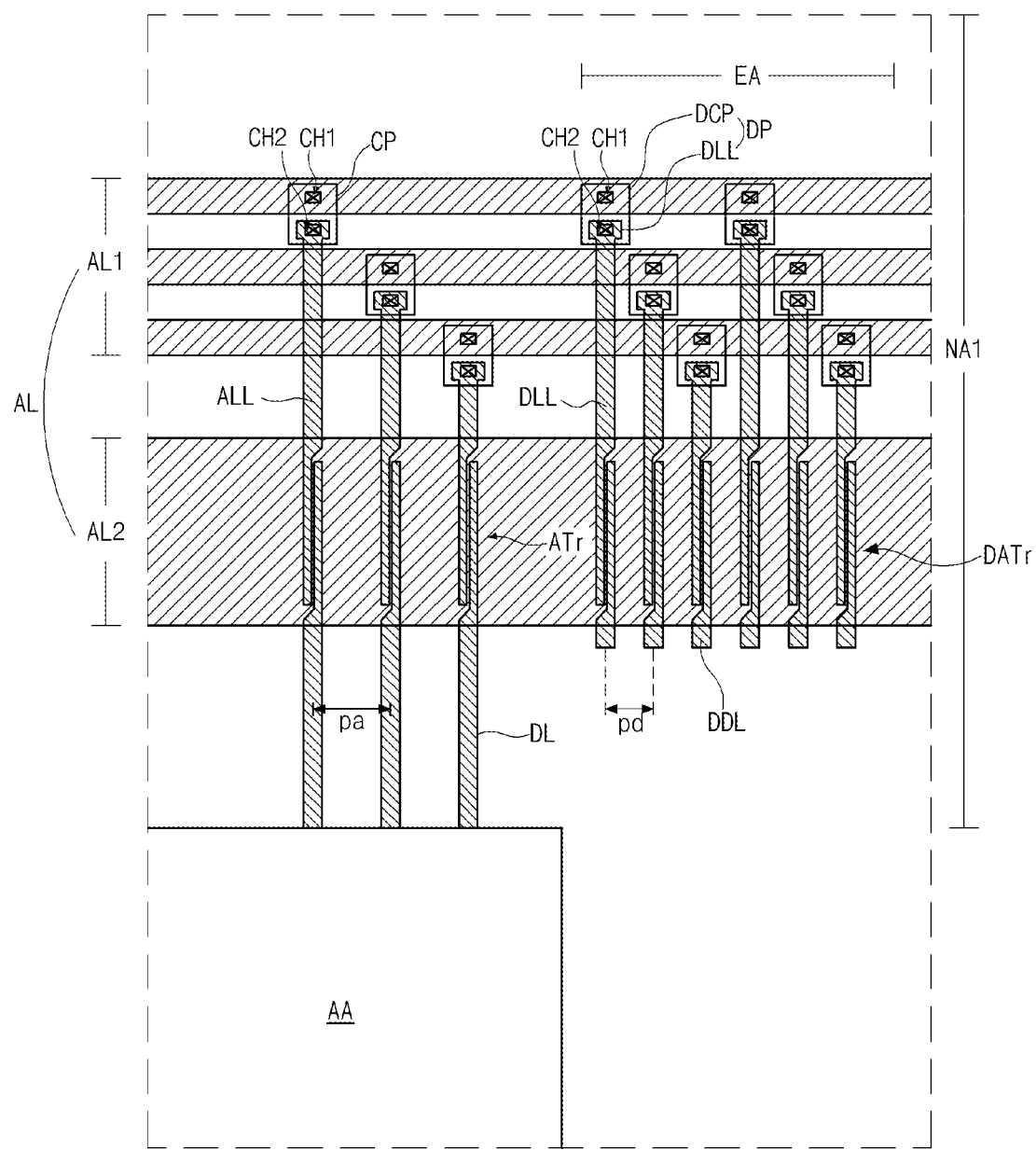
FIG. 10 is a view enlarging a portion of a first non-display region of an array substrate according to the third embodiment of the present invention.

FIG. 9 is a schematic view illustrating an array substrate of an LCD according to a third embodiment of the present invention, and FIG. 10 is a view enlarging a portion of a first non-display region of an array substrate according to the third embodiment of the present invention.

The array substrate AS of the third embodiment is similar to that of the first or second embodiment, except for a component functioning as an electrostatic induction element, and explanations of the similar parts may be omitted.

Referring to FIG. 9, in the array substrate AS, a display region AA and a non-display region NA surrounding the display region AA are defined, and the non-display region NA includes first and second non-display regions NA1 and NA2 located opposite to each other with the display region AA therebetween.

In the second non-display region NA2, an IC region ICA, where a driving circuit, for example, an driving IC to operate a liquid crystal panel is mounted, may be defined. In the IC region ICA, pads coupled to bumps of the driving IC may be formed. In other words, input pads IP corresponding to input pads of the driving IC and output pads OP corresponding to output pads of the driving IC may be formed.

Even though not shown in the drawings, connection pads to receive driving signals output from a driving board, which is connected to the liquid crystal panel through a flexible printed circuit film, may be formed in the second non-display region NA2. The connection pads may be configured to be coupled to connection terminals of the flexible printed circuit board and to be connected to the corresponding input pads IP through corresponding lines.

The output pad OP is connected to one end of the corresponding data line DL. Accordingly, a data signal output from the driving IC is transferred to the data line DL through the output pad OP and applied to the corresponding pixel region P.

One end of the gate line GL is connected to the corresponding gate pad GP located in the non-display region NA and is supplied with a gate signal to operate the gate line GL.

In a portion of the second non-display region NA2, for example, in a region outside the IC region ICA, test pads AP to conduct an auto probe test may be formed. In another example, the test pads AP may be located in other non-display region NA different from the second non-display region NA.

In the auto probe test, the test pads AP are in contact with corresponding probes and supplied with test signals. The test pads AP may include, for example, a first test pad AP supplied with a test data signal, and a second test pad AP2 supplied with a test enable signal to control output of the test data signal into the display region AA.

In the auto probe test, a test gate signal may be supplied directly to the gate pad GP. In other words, the gate pad GP may be configured such that it functions as a test pad thus contacts a corresponding probe to receive the test gate signal.

In another example, a test pad supplied with a test gate signal, and a test pad supplied with a test enable signal to control output of the test gate signal into the display region AA may be further formed.

In the first non-display region NA1, signal transfer lines AL are formed and extends along a length direction of the first non-display region NA1 (i.e., a horizontal direction on the drawings). The signal transfer lines AL may be configured to extend in the non-display region between the first and second non-display regions NA1 and NA2 to be connected to the corresponding test pads AP.

The signal transfer lines AL may include a first signal transfer line AL1 connected to the first test pad AP1 to transfer the test data signal, and a second signal transfer line AL2 connected to the second test pad AP2 to transfer the test enable signal.

A plurality of first signal transfer lines AL1 and a plurality of corresponding first test pads API may be used, and for the purpose of explanations, this embodiment is described with three first transfer lines AL1 and three first test pads API by way of example.

The three first signal transfer lines AL1 may be alternately connected to the other ends of the data lines DL. In other words, the three first signal transfer lines AL1 may correspond to three neighboring data lines, respectively.

To connect the first signal transfer lines AL1 to the corresponding data lines DL, leading lines ALL extending from the corresponding first signal transfer lines AL1 in a direction to the display region AA may be formed. One end of the leading line ALL may be in contact with the corresponding first signal transfer line AL1 through a connection pattern CP.

Further, the other end of the leading line ALL is connected to a signal input terminal i.e., a source terminal of a test transistor ATr formed in the first non-display region NA1. An output terminal i.e., a drain terminal of the test transistor ATr is connected to the other end of the data line DL. As such, the test transistor ATr is located between the leading line ALL and the data line DL.

A control terminal i.e., a gate terminal of the test transistor ATr is connected to the second signal transfer line AL2. Accordingly, the test transistor ATr is operated to be turned on or off according to the test enable signal transferred through the second signal transfer line AL2 and controls an output of the test data signal.

A plurality of dummy patterns DP and a plurality of dummy test transistors DATr connected to the respective dummy patterns DP are formed in the first non-display region NA1 and function as electrostatic induction elements. The dummy pattern DP and the dummy test transistor DATr are formed at respective end portions EA of the first signal transfer line AL1 and the second signal transfer line AL2 i.e., at terminating portions, in a signal transfer direction, of the first signal transfer line AL1 and the second signal transfer line AL2.

The dummy pattern DP and the dummy test transistor DATr connected to each other have substantially the same structure as the connection pattern CP, the leading line ALL and the test transistor ATr connected to one another but have no electrical connection with an inside of the display region AA. In other words, a structure of the dummy pattern DP and the dummy test transistor DATr connected to each other are configured to be in connection with the first and second signal transfer lines AL1 and AL2 and have no output structure for the test data signal.

The structure of the dummy pattern DP and the dummy test transistor DATr connected to each other is a conductor and a capacitor and functions inherently to bring charges thereinto. Further, regarding electric components in the first non-display region NA1, from the point of view of an electric circuit, the structure of the dummy pattern DP and the dummy test transistor DATr is a conductor and a capacitor located at an endmost portion, and thus charges flow into this structure of the dummy pattern DP and the dummy test transistor DATr much more than other electric components having an electrical connection relation with the display region AA Accordingly, electrostatic charges flowing into the first non-display region NA1 can be mostly inducted into the structure of the dummy pattern DP and the dummy test transistor DATr. Accordingly, it can be prevented that a defect of the test signal transfer line AL or test transistor ATr, or a defect of a signal line or driving element in the display region AA happens due to a static electricity.

Further, even though excessive electrostatic charges flow into the dummy pattern DP and the dummy test transistor DATr and an electrostatic burst happens, this does not substantially influence the transfer of the test signals because the dummy pattern DP and the dummy test transistor DATr are located at the end portions EA of the signal transfer lines AL.

A structure of components arranged in the first non-display region NA1 is explained in detail with further reference to FIG. 10.

The connection pattern CP connecting the first signal transfer line AL1 and leading line ALL corresponding to each other may contact the first signal transfer line AL1 through a first contact hole CH1, and contact the leading line ALL through a second contact hole CH2.

In this regard, the first signal transfer line AL1 and the leading line ALL are arranged with at least one insulating layer therebetween in a cross section view. For example, the first signal transfer line AL1 may be formed at the same process and of the same material as the gate line GL, the leading line ALL may be formed at the same process and of the same material as the data line DL, and the gate insulating layer (113 of FIG. 6) may be located between the first signal transfer line AL1 and the leading line ALL. The connection pattern CP may be formed at the same process and of the same material as the pixel electrode (130 of FOG. 6), and the passivation layer (125 of FIG. 6) may be located between the connection pattern CP and the leading line ALL.

The test transistor ATr may be configured with a part of the second signal transfer line AL2 as a gate terminal i.e., a gate electrode, a part of the leading line ALL as a source terminal i.e., a source electrode, and a part of the data line DL as a drain terminal i.e., a drain electrode. Even though not shown in the drawings, a semiconductor layer may be located over the gate electrode. The test transistor ATr may be formed at the same process as the thin film transistor (T of FIG. 6) in the pixel region P.

The dummy pattern DP and the dummy test transistor DATr are located at the outside of the connection pattern CP located last with respect to the test signal transfer direction i.e., at the end portions EA of the first and second signal transfer lines AL1 and AL2.

The dummy pattern DP may include a dummy connection pattern DCP, the dummy test transistor DATr may include a dummy leading line DLL and a dummy data line DDL, and the dummy pattern DP and the dummy test transistor DATr may be connected to each other through the dummy leading line DLL.

The dummy data line DDL is a dummy line for the data line DL, and may have a shape of at least part of the data line DL, and in this embodiment, the dummy data line DDL having a length less than the data line DL is shown by way of example.

In this embodiment, it is preferable, but not limited, that a pitch pd of the structures each having the dummy pattern DP and the dummy test transistor DATr connected to each other i.e., a pitch pd of dummy test structures is less than a pitch pa of the corresponding test structures. Particularly, when the pitch pd of the dummy test structures is less than the pitch pa of the test structure, a number of the dummy test structures per unit area increases, and thus an electrostatic induction effect can be further improved.

Further, as explained in the above second embodiment, it is preferable, but not limited, that the channel width (wd of FIG. 8) of the semiconductor layer (SEd of FIG. 8) of the dummy test transistor DATr is greater than the channel width (wa of FIG. 8) of the semiconductor layer (SEa of FIG. 8) of the test transistor ATr. Particularly, when the channel width of the dummy test transistor DATr is greater than the channel width of the test transistor ATr, a channel current property of the dummy test transistor DATr increases, and an electrostatic induction effect can be further improved.

As described above, by forming the structure of the dummy pattern DP and the dummy test transistor DATr as the electrostatic induction element, the related art electrostatic induction line does not need, and thus better use of a space for the first non-display region NA1 can be made. Particularly, a common voltage line located in the first non-display region NA1 can be formed at a larger area. Accordingly, a capability to maintain a common voltage inside the display region AA can be improved, and a display quality defect such as a flicker can be prevented.

This embodiment can be applied to an example that in order to output test gate signals to the display region, test pads, test signal transfer lines, and test transistors are used.

According to the above-described embodiments, in the non-display region having the signal transfer line to transferring the test signal and the test transistor, a dummy structure that includes at least part of the structure transferring the test signal from the signal transfer line into the display region is formed as an electrostatic induction element.

Accordingly, electrostatic charges, which flow into the non-display region, are mostly inducted into the dummy structure. Thus, it can be prevented that a defect of the signal transfer line or test transistor, or a defect of a signal line or driving element in the display region happens due to a static electricity after the cutting by a cell region in the related art.

Further, the related art electrostatic induction line does not need in the non-display region, and thus better use of a space for the non-display region can be made. Particularly, a common voltage line located in the non-display region can be formed at a larger area. Accordingly, a capability to maintain a common voltage inside the display region can be improved, and a display quality defect such as a flicker can be prevented.

The above embodiments can be applied to all types of display devices including the LCD.

It will be apparent to those skilled in the art that various modifications and variations can be made in a display device of the present invention without departing from the sprit or scope of the disclosure. Thus, it is intended that the present invention covers the modifications and variations of this disclosure provided they come within the scope of the appended claims and their equivalents.

What is claimed is:

1. A display device, comprising:
an array substrate that includes a display region and first and second non-display regions located opposite to each other with the display region therebetween, and includes a gate line that extends along a first direction and a data line that extends along a second direction crossing the first direction, the data line having a first end located in the first non-display region and a second end located in the second non-display region;
an output pad that is in the second non-display region and is connected to the second end of the data line;
a first signal transfer line that extends along the first direction in the first non-display region, the first signal transfer line having a length along the first direction that is greater than a width of the display region along the first direction from a first side boundary of the display region to a second side boundary of the display region that is opposite the first side boundary;

a connection pattern that is connected to the first signal transfer line in the first non-display region, and is connected to the first end of the data line in the first non-display region; and a dummy pattern connected to the first signal transfer line in the first non-display region.

2. The device of claim 1, further comprising:
a second signal transfer line between the first signal transfer line and the gate line;
a test transistor that is connected to the first end of the data line and is connected to the second signal transfer line; and
a dummy test transistor that is connected to the second transfer signal line.

3. The device of claim 2, further comprising:
a first test pad in the second non-display region connected to the first signal transfer line; and
a second test pad in the second non-display region connected to the second signal transfer line.

4. The device of claim 2, further comprising:
a first test pad connected to the first signal transfer line; and
a second test pad connected to the second signal transfer line, wherein the first and second test pads are outside of the second non-display region.

5. The device of claim 2, wherein the dummy pattern is connected to the dummy test transistor.

6. The device of claim 2, further comprising a leading line that connects the connection pattern to the test transistor, wherein the dummy pattern includes a dummy leading line connected to the dummy test transistor.

7. The device of claim 6, wherein the dummy leading line is configured to have a shape of at least part of the leading line.

8. The device of claim 2, further comprising a dummy data line connected to the dummy test transistor.

9. The device of claim 8, wherein the dummy data line is configured to have a shape of at least part of the data line.

10. The device of claim 1, wherein a pitch of the dummy pattern is less than that of the connection pattern.

11. The device of claim 2, wherein a pitch of the dummy test transistor is less than that of the test transistor.

12. The device of claim 2, wherein a channel width of a semiconductor layer of the dummy test transistor is greater than that of the test transistor.

13. The display device of claim 1, further comprising:
a second signal transfer line between the first signal transfer line and the gate line; and
a test transistor connected between the connection pattern and the second end of the data line, the test transistor having a gate terminal connected to the second signal transfer line.

14. A display device, comprising:
an array substrate having a display region, a first non-display region adjacent to a first side boundary of the display region, and a second non-display region adjacent to a second side boundary of the display region that is opposite the first side boundary, the array substrate including:
a gate line extending along a first direction, and
a data line extending along a second direction that is transverse to the first direction;
an output pad in the second non-display region and connected to a first end of the data line;
a first signal transfer line extending along the first direction in the first non-display region, the first signal transfer line having a length along the first direction that is greater than a width of the display region along the first direction from a third side boundary of the display region to a fourth side boundary of the display region that is opposite the third side boundary;
a connection pattern in the first non-display region, the connection pattern connected to the first signal transfer line and to a second end of the data line that is opposite the first end of the data line; and
a dummy pattern connected to the first signal transfer line in the first non-display region.

15. The display device of claim 14, wherein a pitch of the dummy pattern is less than that of the connection pattern.

16. A display device, comprising:
an array substrate having a display region, a first non-display region adjacent to a first side of the display region. and a second non-display region adjacent to a second side of the display region that is opposite the first side, the array substrate including:
a gate line extending along a first direction, and
a data line extending along a second direction that is transverse to the first direction:
an output pad in the second non-display region and connected to a first end of the data line;
a first signal transfer line extending along the first direction in the first non-display region, the first signal transfer line having a length that is greater than a width of the display region along the first direction;
a connection pattern in the first non-display region, the connection pattern connected to the first signal transfer line and to a second end of the data line that is opposite the first end of the data line;
a dummy pattern connected to the first signal transfer line in the first non-display region;
a second signal transfer line between the first signal transfer line and the gate line; and
a test transistor connected between the connection pattern and the second end of the data line, the test transistor having a gate terminal connected to the second signal transfer line.

17. The display device of claim 16, further comprising:
a first test pad connected to the first signal transfer line; and
a second test pad connected to the second signal transfer line.

18. The display device of claim 17, wherein the first and second test pads are located outside of the second non-display region.

19. The display device of claim 17, wherein the first and second test pads are located in the second non-display region.

20. The display device of claim 16, further comprising a leading line connected between the connection pattern and the test transistor, the leading line extending along the second direction in the first non-display region.

* * * * *